(12) United States Patent
Gagnon (10) Patent No.: US 11,463,094 B1
(45) Date of Patent: Oct. 4, 2022

(54) DIGITAL FILTER FOR SECOND TAP OF DFE

(71) Applicant: Cadence Design Systems, Inc., San Jose, CA (US)

(72) Inventor: Mathieu Gagnon, Montréal (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/305,573

(22) Filed: Jul. 9, 2021

(51) Int. Cl.
*H03L 7/087* (2006.01)
*H03L 7/08* (2006.01)
*H04L 25/03* (2006.01)

(52) U.S. Cl.
CPC ............ *H03L 7/087* (2013.01); *H03L 7/0807* (2013.01); *H04L 25/03025* (2013.01)

(58) Field of Classification Search
CPC .. H03L 7/087; H03L 7/0807; H04L 25/03025
See application file for complete search history.

(56) References Cited

U.S. PATENT DOCUMENTS 9,397,868 B1\* 7/2016 Hossain ................ H04L 7/0087
10,193,716 B2\* 1/2019 Hormati ............ H04L 25/03057
10,326,623 B1\* 6/2019 Tajalli ............... H04L 25/03038

\* cited by examiner

*Primary Examiner* — Vineeta S Panwalkar
(74) *Attorney, Agent, or Firm* — Schwegman Lundberg & Woessner, P.A.

(57) ABSTRACT

Various embodiments provide a method or system that implements a two-tap decision feedback equalizer by applying a first tap and a second tap on a first symbol of a data signal, each of the first and second taps having a first and second polarity to generate a first corrected data symbol and a second corrected data symbol. The first corrected data symbol and the second corrected data symbol is provided to a comparator to select a data symbol. The output of the comparator is provided to a clock data recovery circuit along with a previous data symbol of the data signal preceding the first data symbol.

20 Claims, 8 Drawing Sheets

DIGITAL FILTER FOR SECOND TAP OF DFE

TECHNICAL FIELD

Embodiments of the present disclosure relates to systems and methods for applying a digital filter as a second tap of a decision feedback equalizer (DFE) in accordance with some embodiments.

BACKGROUND

Conventional high speed serial communication systems include various components that are used by the receiving device to receive, filter, recover, and correct errors and in the data signal from transmitter. Many serial receiver systems perform decision feedback equalization (DFE) on received data. Such serial receiver systems can include (i) an analog front end that provides some continuous time linear equalization (CLTE), (ii) a sampler, (iii) a DFE that uses the quantized received data to adaptively feedback a correction signal, and (iv) a timing recovery unit. The timing recovery unit can use edge samples of the signal to determine if the received timing is early or late (e.g., via phase detection). This information can be forwarded to a digital loop filter which outputs into a phase selector to generate a recovered clock signal. The recovered clock signal is then used to sample the input signal and process the received data.

As high-speed serial communications become faster, it becomes more important to recover the transmitted signal for proper signal processing. To aid in recovery of the transmitted signal at the receiver, decision feedback equalizers are used to correct a current symbol based on levels of previous symbols and to cancel out inter-symbol interference (ISI). Adding multiple tap values (decision points) increases the accuracy of the recovered signal but add additional cost in timing delay and hardware.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

The following description of embodiments provides non-limiting representative examples referencing numerals to particular describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

In various digital systems, signals can be transmitted from a transmitter to a receiver via a transmission channel. The transmission channel can be any suitable wired or wireless medium which operably couples the transmitter to the receiver. In many instances including high data transmission speeds, the transmission channel becomes lossy. The transmitted signal can become lossy as a result of interference, attenuation, and delay in the channel, among other factors. Such losses can cause significant detrimental effects on the transmitted signal when it is received by the receiver. Sufficient amplitude and phase distortion of the transmitted signal can result in intersymbol interference (ISI) in the signal received at the receiver. ISI generally refers to the 'smearing' of a pulse or other symbol representing the logic state of one data bit to the degree such that it contributes to the content of one or more of the preceding (e.g., pre-cursor ISI) or succeeding (e.g., Post-cursor ISI) data bits.

To alleviate these detrimental effects, many serial receiver systems perform decision feedback equalization (DFE) on the received data. The DFE corrects for impedance discontinuities introduced into the signal from connectors, physical interfaces between boards, cables, and others.

Many serial receiver systems perform decision feedback equalization (DFE) on received data. Such serial receiver systems can include (i) an analog front end that provides some continuous time linear equalization (CLTE), (ii) a sampler, (iii) a DFE that uses the quantized received data to adaptively feedback a correction signal, and (iv) a timing recovery unit. The timing recovery unit can use edge samples of the signal to determine if the received timing is early or late (e.g., via phase detection). This information can be forwarded to a digital loop filter which outputs into a phase selector to generate a recovered clock signal. The recovered clock signal is then used to sample the input signal and process the received data.

In a decision feedback equalizer (DFE), it is necessary to add weighted information from previous bits to the received signal to decide on the current bit. At high data rates, the design of a linear and precise summer that meets the DFE timing requirement is challenging. Conventionally, taps of the equalizer are implemented using current-mode summers, thus the power consumption of the DFE increases proportionally with the number of taps. The extra capacitance due to equalization taps also introduces additional loading at the summer output and limits its bandwidth. Accordingly, there is a need for a solution that provides the precision of a two tap DFE circuit without the conventional hardware that is used to provide such functionalities.

However, methods to recover high fidelity clock signals can require high amounts of signal correction by taps in a DFE. The addition of taps allows the DFE to recover a more accurate signal and improve the overall performance of the serializer deserializer (SERDES). The addition of more taps, however, comes with significant power drawbacks, physical space limitations, as well as additional timing/synchronization complexities.

One aspect of the present disclosure is to provide systems and methods for implementing a second tap unrolled DFE. The systems and the methods described herein address at least one of the problems discussed above.

Conventional two-tap unrolled DFE circuits include corrections for both a positive and a negative tap correction. For example, a first tap includes both a positive and negative tap correction and a second tap also includes a positive and negative tap correction.

To solve this technical problem, in some embodiments of the present disclosure, the methods and systems described herein contemplates a solution taking advantage of a clock recovery circuit using an average of inputted values. A two-tap unrolled edge sampler DFE circuit is implemented by applying two corrections in parallel, a first correction applying a first and a second tap, a second correction applying a first and a second tap. The first correction is corrected fully by applying both a positive and negative correction, whereas the second correction is corrected "in part" by applying either a positive or a negative correction. When the second correction that is applied is the "correct" polarity, the clock data recovery circuit selects the sample. If not, the clock data recovery circuit waits for a new sample that is of the "correct" polarity. Described in other words, the clock data recovery circuit receives a data sample that has a 50% probability of being of the correct polarity (per a previous digital decision). This allows the implementation of a two-tap unrolled DFE using the hardware components of a single tap unrolled DFE, saving costs in at least the physical area, material costs, and power consumption.

According to certain aspects, a non-transitory computer-readable medium on which are stored instructions that are executable by a processor and that, when executed by the processor, cause the processor to generate a circuit design by performing operations including configuring, in a circuit design, a first portion of a decision feedback equalizer to apply a first correction comprising a first tap having a polarity (e.g., positive or negative) plus a second tap to a first symbol of a data signal received by a data sampler circuit. A polarity of the second tap remains constant for the first and second corrections. The operations further include configuring, in the circuit design, a second portion of the decision feedback equalizer configured to apply a second correction comprising a first tap having an opposite polarity of the first tap applied at the first correction. The first correction and the second correction are applied in parallel. The operations further include configuring, in the circuit design, a multiplexer configured to receive an output of the first portion and an output of the second portion and a clock data recovery circuit configured to receive an output of the multiplexer and an input of a previous data decision by the decision feedback equalizer.

According to some embodiments, embodiments provide a method for implementing a two tap DFE at an edge sampler. A first portion of a decision feedback equalizer applies a first correction comprising a first tap of a first polarity (e.g., positive) plus a second tap of a second polarity (e.g., negative) to a symbol of a data signal and a second portion of the decision feedback equalizer applies a second correction comprising the first tap of an inverse polarity of the first tap of the first correction (e.g., negative) and the second tap of the same polarity of the first correction (e.g., negative). A multiplexer is configured to receive an output of the first correction and an output of the second correction to provide an output to a clock recovery circuit. In accordance with some embodiments, the clock recovery circuit is configured to receive a previous data decision and further selects whether the output of the multiplexer is to be used for clock data recovery based on the previous data decision.

For example, correction1=tap1+tap 2, with tap1 and tap2 being both applied with positive polarities, and correction2=−tap1+tap2 with tap1 being applied with negative polarities. The clock data recovery circuit is configured to select/accept results of the correction for which bit N−2 was 1, meaning a positive second tap (+tap2) was the correct polarity. It is understood that in these examples, the polarity of the taps are valuable. The weight of the taps can vary between tap1 and tap2.

In another example, correction1=tap1−tap2 with tap1 having a positive polarity and tap2 having a negative polarity, and correction2=−tap1−tap2, with tap1 and tap 2 each being a negative polarity. The clock data recovery circuit is configured to select/accept results of the correction for which bit N−2 was 0, meaning a negative second tap (−tap2) was the correct polarity.

According to some embodiments, a circuit includes a data sampler circuit and a clock data recovery circuit coupled to the data sampler circuit. The data sampler circuit includes a first and a second portion coupled to a multiplexer and a filter. The first portion of the data sampler is configured to receive a data signal including one or more data symbols, apply a first correction on a first data symbol of the data signal, generate a first corrected data symbol and output the first corrected data symbol. The second portion of the data sampler is configured to receive the data signal including data symbols, apply a second correction on the first data symbol, the second correction, the second correction being distinct from the first correction, generating a second corrected data symbol and outputting the second corrected data symbol. In some embodiments, both the first portion of the data sampler and the second portion of the data sampler apply each of the first and second corrections at a same time. The multiplexer is configured to receive the first corrected symbol, the second corrected data symbol and to select the first or the second corrected data symbol and output the selected corrected data symbol to the clock data recovery circuit, which selects or rejects the selected corrected data symbol based upon a previous data symbol.

The various operations of example methods described herein may be performed, at least partially, by one or more processors that are temporarily configured (e.g., by software) or permanently configured to perform the relevant operations. Similarly, the methods described herein may be at least partially processor implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Figure 1:
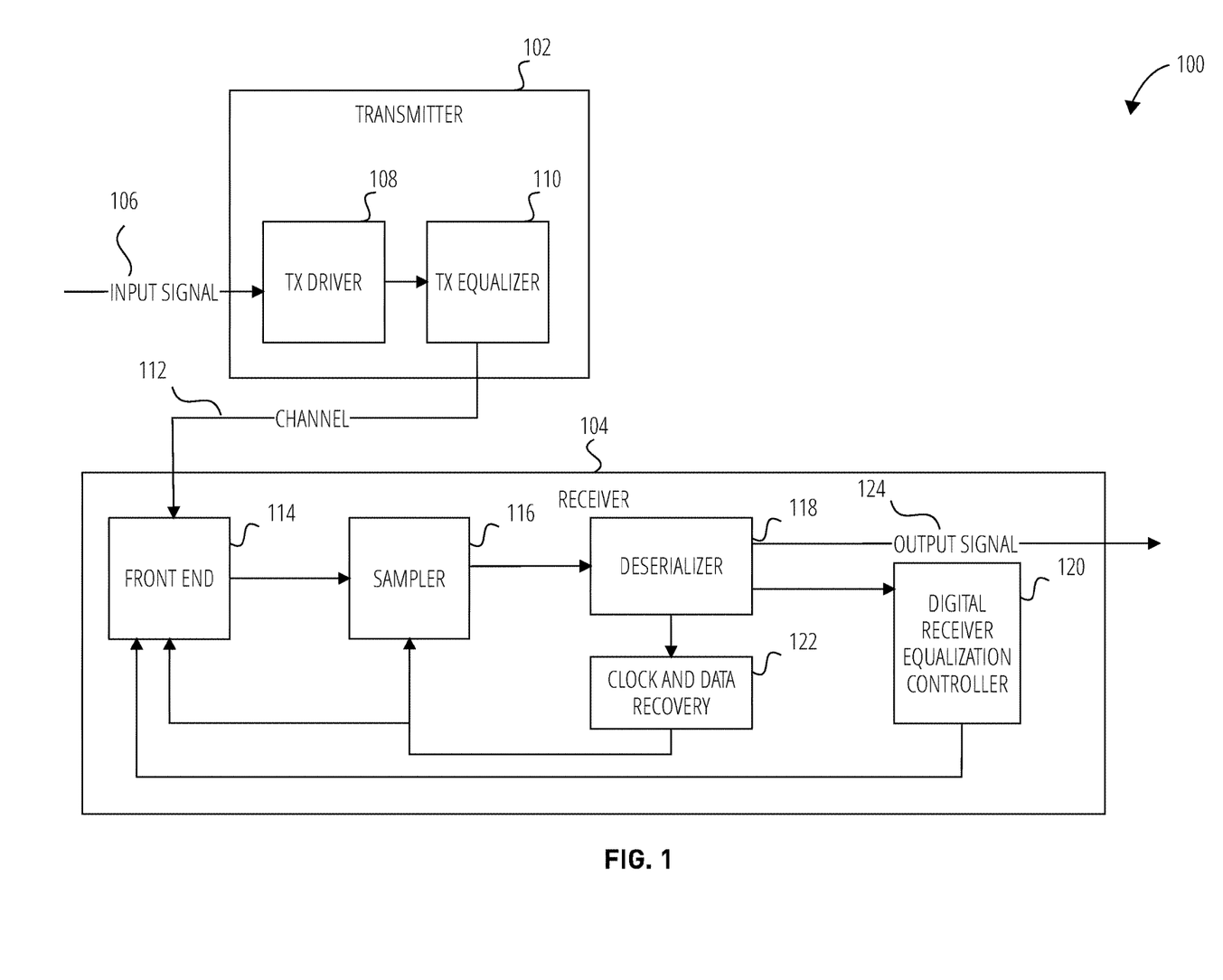
FIG. 1 illustrates a block diagram of a high-speed transmission system in accordance with some embodiments.

FIG. 1 is a block diagram of a communication system in accordance with some embodiments. The system 100 can include a transmitter 102, a receiver 104, and at least one channel 112 connecting the transmitter to the receiver. In some embodiments, the transmitter 102 and the receiver 104 can be implemented in one or more integrated circuits (ICs). The channel 112 can be unidirectional or bidirectional and can transmit data different using a positive and negative polarity data signal. A single-ended implementation is also possible.

The transmitter 102 receives an input signal 106 to be transmitted and transmits a representation of the input signal using a transmission (TX) driver 108. The system 100 can be a serial communication system, in which the input signal 106 can be serialized before or after being input to the transmitter. The TX driver 108 can form a differential signal based on the input signal. The differential signal can have a specified amplitude, the value of which can vary depending on the communication standard by which the transmitter communicates with the receiver.

The transmitter 102 can include a TX equalizer 110, which can be implemented using a feed-forward equalizer (FFE) having adjustable tap weights. In some embodiments, the TX equalizer 110 and TX driver 108 are combined into a single circuit block.

The input to receiver 104 can be processed through a front end 114, which can include a linear and/or non-linear equalizer with programmable gain and/or frequency shaping, a sampler 116, and a deserializer 118.

The front end 114 can also receive outputs from a digital receiver equalization controller 120 and a sampler 116. Specifically, the front end 114 sums the weighted and delayed outputs from the sampler to the received signal. The weight values are determined by the digital receiver equalization control (DFE). In an embodiment, the sampler 116 samples and quantizes the received signal to generate in-phase (I) and quadrature (Q) samples over a series of predetermined unit intervals (UI), with each Q sample being disposed between consecutive I samples. Further, the sampler samples the received signal based on a plurality of clock signals output from the clock and data recovery unit. In an embodiment, the sampler sends the sampled data to the front end 114 and deserializer.

The deserializer 118 deserializes the quantized data and provides the deserialized data to the digital receiver equalization controller 120 and the clock and data recovery unit 122 and in some embodiments, provides the deserialized data as an output signal 124. In some embodiments, the deserializer 118 samples the quantized data at the edge of the I sample and the center of the I sample.

In some embodiments, the digital receiver equalization controller carries out predetermined control processing for the equalization utilized by the receiver based on data received from the deserializer and feeds back various equalization information to the front end 114 to perform the corrective operation. For example, the digital receiver equalization controller sends the DFE weights, the VGA gain, and the CTLE settings to the front end. As a feedback equalizer, the sampler generally makes a logic 1 or 0 decision on the sample data. The decision is scaled and delayed and then fed back to the front end 114 where it is added back into the received data. Therefore, the DFE establishes a feedback loop where the decision is made in that loop.

The clock and data recovery unit 122 and data recovery receives the I and Q data samples from the deserializer and based on the I and Q data, determines if the sampler is running too slow or too fast. To correct the late or early clock rate of the sampler, the clock and data recovery unit 122 generates a plurality of clocks to provide to the sampler 116.

A clock and data recovery 122 can include a phase detector, a loop filter, and a phase interpolator in accordance with some embodiments. The phase detector can be configured to receive a plurality of deserialized data samples from the deserializer 118. For example, the deserializer 118 transmits deserialized I, Q, Qp, and Qm data samples to the phase detector. In some embodiments, the Qp data samples correspond to Q data samples shifted in the positive direction by a value associated with one of the previously discussed DFE weights (e.g., coefficients). Similarly, the Qm data samples correspond to Q data samples shifted in the negative direction by a value associated with the DFE coefficient. Based on the received data samples (i.e., I, Q, Qp, and Qm), the phase detector will generate one of an early, late, or no update signal. For example, to represent an early signal, the phase detector can generate a value of "01" to represent a late signal, the phase detector can generate a value of "10" and to represent that no update is needed, the phase detector can generate a value of "00." In some embodiments, the phase detector performs the early/late analysis for each of the n number of deserialized samples of the I, Q, Qp, and Qm data samples.

Accordingly, the phase detector will provide N number of early/late signals to the loop filter for processing where the loop filter determines whether, over a certain period of time, the received early/late signals include a majority of early signals or a majority of late signals. Based on this determination, the loop filter generates one of an early or late signal to transmit to the phase interpolator. The loop filter in some embodiments can add the early/late signals over the period of time and based on the sign of the sum and generate one of an increment or decrement signal. For example, an early signal is associated with a "+1" and a late signal is associated with a "−1" and the signals requiring no updates are associated with "0". If the sum of all of the early/late signals are associated with a positive sign, or a value greater than 0, it is assumed that the majority of the early/late signals were early signals. Similarly, if the sum of all of the early/late signals are associated with a negative sign or a value less than 0, it can be assumed the majority of the signals were late signals. This early/late signal is filtered digitally. In some embodiments, the phase interpolator modifies the phase of the plurality of clocks being provided to the sampler based on the received early or late signal. For example, if the loop filter transmits an early signal, the phase interpolator decrements the phase of the plurality of clocks. In some embodiments decreasing the phase implies that the phase of the sampler clock is shifted earlier in time. Similarly, if the loop filter transmits a late signal, the phase interpolator increments the phase of the plurality of clocks and the phase of the sampler clock is shifted later in time. In some embodiments, after modifying the clocks, the phase interpolator provides the modified clocks to the sampler 116.

Figure 2:
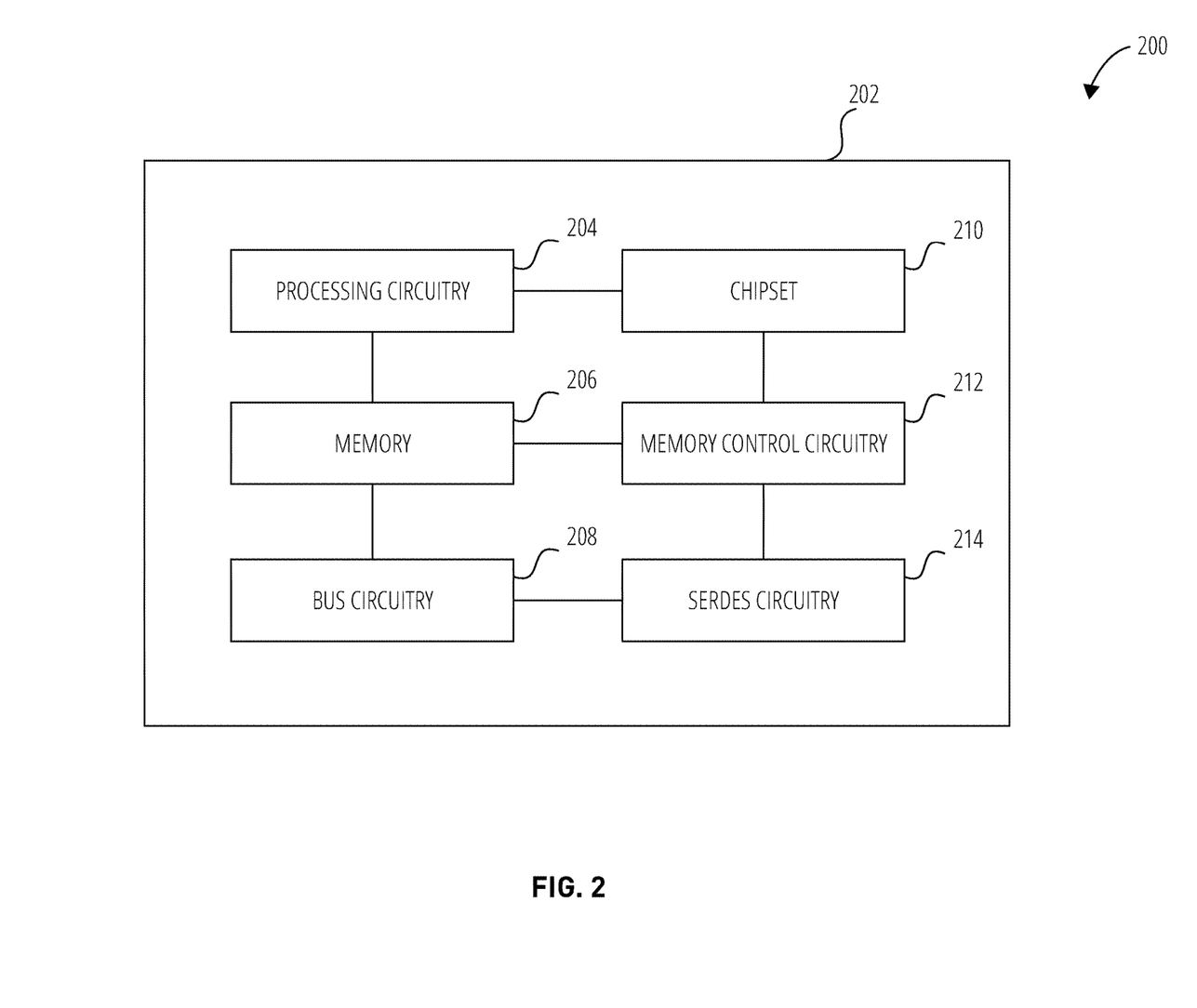
FIG. 2 illustrates a block diagram of an integrated circuit (IC) in accordance with some embodiments.

FIG. 2 is a block diagram 200 of an example integrated circuit (IC) 202 in accordance with some embodiments. The term "integrated circuit," as used herein can refer to a semiconductor device and/or microelectronic device, such as, for example, but not limited to, a semiconductor integrated circuit chip. The specific configuration, arrangement, and components shown in IC 202 are provided merely for exemplary purposes as additional and/or alternative configurations are also within the scope of the present disclosure.

In some embodiments, the IC 202 can include core processing circuitry 204, which can include one or more of any suitable processors. The IC 202 can also include chipset 210. In some embodiments, the chipset 210 can include both Northbridge/memory controller hub (MCH) and Southbridge I/O controller hub (ICH) circuitry. These components can be included within the chipset 210 or at any other location within the IC 202.

The IC 202 can also include memory 206, which can be in communication with core processing circuitry 204. Memory 206 can comprise one or more of the following types of memories: semiconductor firmware memory, programmable memory, non-volatile memory, random access memory, flash memory (including NAND and/or NOR type memory architectures), magnetic disk memory, and/or optical disk memory. Either additionally or alternatively, memory can comprise other and/or future developed types of computer-readable memory.

IC 202 can additionally include memory control circuitry 212 configured to provide compatibility with a variety of different bus circuitry 208, including, but not limited to, Universal Serial Bus (USB), Serial Advanced Technology Attachment (SATA), Peripheral Component Interface (PCI), PCI-Express, and System Management Bus (SMBus). The IC 202 can also include SerDes circuitry 214, which can include numerous components configured to transmit/receive one or more high-speed data streams.

Figure 3:
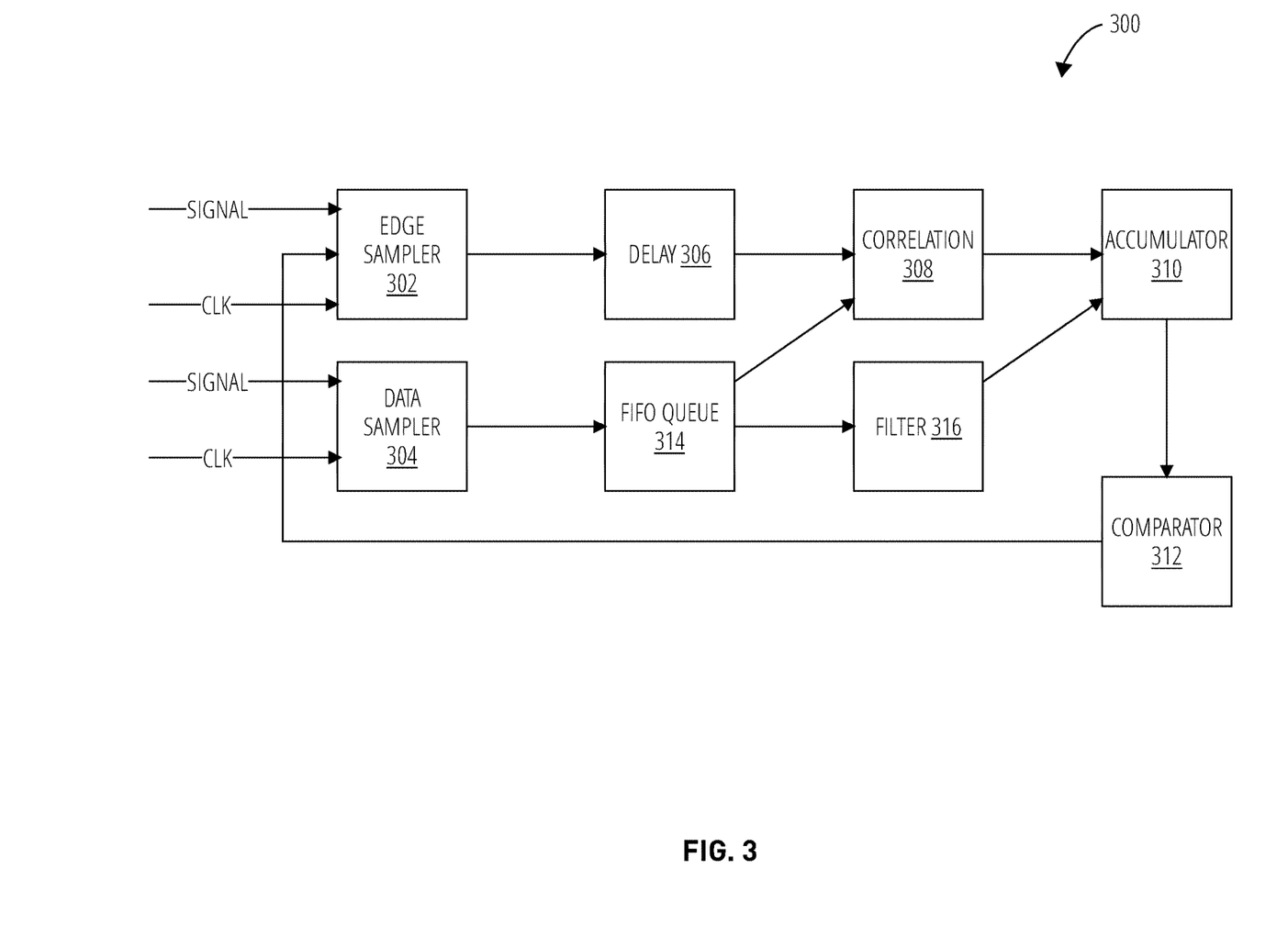
FIG. 3 illustrates a block diagram of a partial receiver in accordance with some embodiments.

FIG. 3 illustrates a block diagram of a partial receiver 300 in accordance with some embodiments. In some embodiments, an edge sampler 302 can convert a received input signal into an error signal representing an error sample E(N) measured for the same UI (N) as the corresponding data sampler 304 Data(N). The error sampler can include analog-to-digital conversion elements such as comparators, voltage reference generators, memory latches, shift registers, etc. The error signal can represent the difference between the input signal and a threshold value generated by a threshold controller. The samples for the error signal can be taken at time intervals controlled by a clock signal.

In some embodiment the data sampler can convert a received input signal into a data signal. The data sampler can include analog-to-digital conversion elements such as comparators, voltage reference generators, memory latches, shift registers, etc. The data signal can represent digital 1's and 0's to form a stream of digital pulses Data(N). The samples for the data signal can be taken at time intervals controlled by the clock signal.

In some embodiments the controller can include a delay generator 306, a FIFO queue 314, a filter 316, a correlation calculator 308, an accumulator 310, and a comparator 312.

In some embodiments, the delay generator 306 can delay the error signal relative to the data signal so that an error sample is correlated with a data sample positioned earlier in time. For example, the delay generator can receive an error sample E(N) from the error sampler and an UI amount D indicated by a signal to generate a delayed error signal E(N-D) delayed by D UIs relative to the data signal Data(N).

In some embodiments, the FIFO queue 314 can store earlier and later samples of the data signal.

In some embodiments the correlation calculator 308 can correlate the error sample E(N-D) with the data sample D(N-C) inputted from the FIFO queue. In some embodiments, the correlation can be performed using a least mean squares algorithm (LMS). The output is sent to the accumulator 310 representing a result of the correlation between the current error sample and each of the multiple pre-cursor bits.

Pre-cursor bits are bits received earlier than a reference sample and will impact the reference bit amplitude in proportion of the magnitude of corresponding post-cursors of the pulse response.

In some embodiments a filter 316 can perform pattern detection logic to look for a particular pattern (e.g., four consecutive identical bits) prior to a current data sample in the number of data bits outputted by the FIFO queue 314. If the particular pattern is detected, the filter can output to the accumulator 310, a signal representing that the correlation result using the currently stored bits is valid. Otherwise, if the pattern is not detected, the filter can output to the accumulator 310 a signal representing that the correlation result using the currently stored bits is not valid, so the accumulator will not accumulate the current correlation result. In some embodiments, filters are bypassed so the accumulator can use all of the correlation results obtained from data samples.

Figure 4:
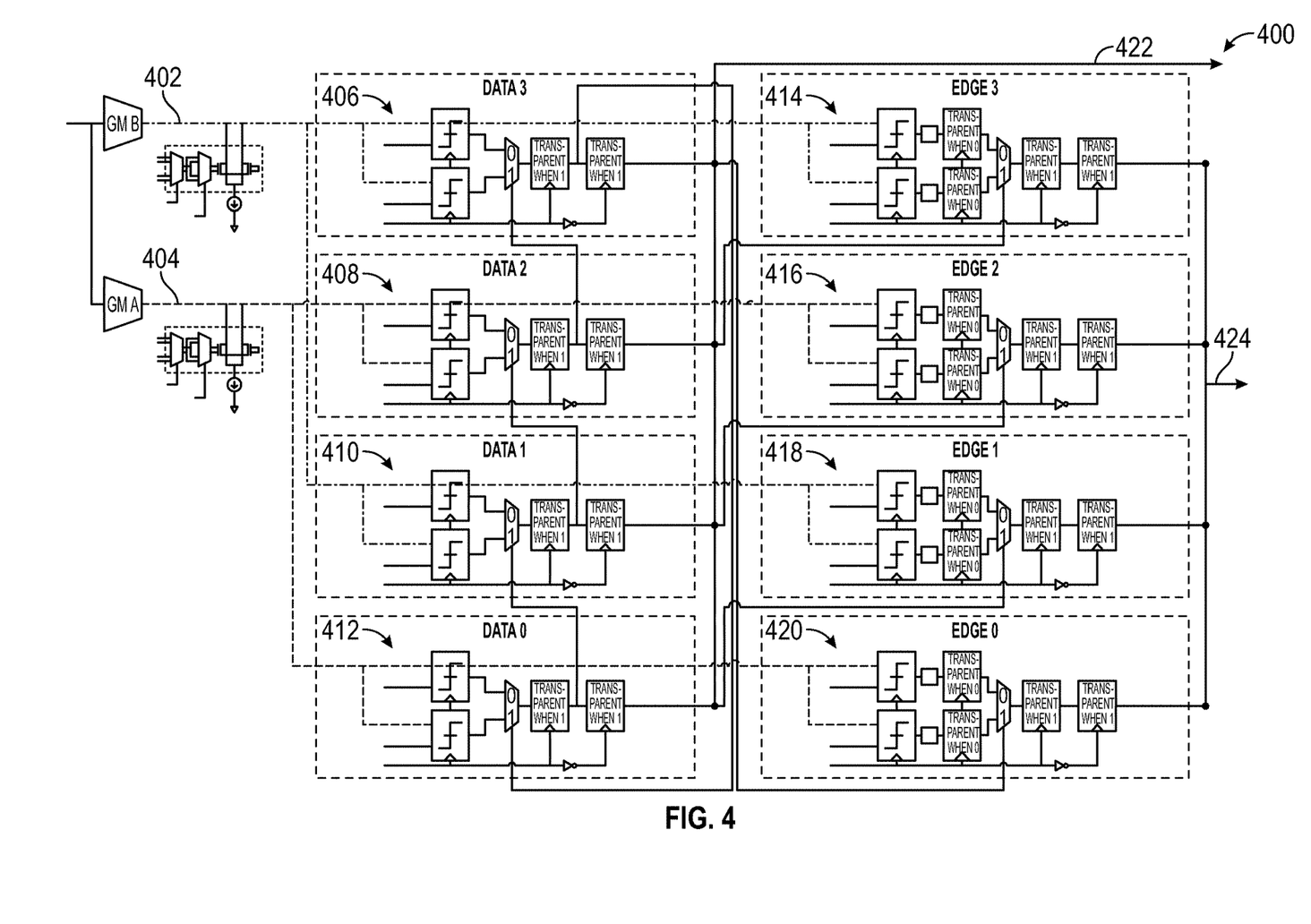
FIG. 4 illustrates an example differential feedback equalizer having various data and edge samplers in accordance with some embodiments.

FIG. 4 illustrates an example differential feedback equalizer having various data and edge samplers in accordance with some embodiments. System 400 is an example of a quarter rate 1-bit loop-unrolled DFE. As shown, input data 402 is operably coupled to data sampler 406 and data sampler 410. Input data 402 is also operably coupled to edge sampler 414 and edge sampler 418.

Input data 404 is operably coupled to data sampler 408 and data sampler 412. Input data 404 is also operably coupled to edge sampler 416 and edge sampler 420.

The output of data samplers 406-408 are provided to the deserializer as output data 422 and the output of edge samplers 414-420 are provided to the deserializer as output data 424.

As shown, system 400 discloses both data and edge samplers that have independent comparison thresholds (e.g., DT_x_y vs. QT_x_y). The clock data recovery correction acts on the edge samplers to apply second edge DFE corrections to thresholds QT_x_y in addition to the first edge DFE correction whose negative and positive corrections are applied to QT_x_1 and QT_x_0, respectively. The first edge DFE taps are applied to QT_x_1 and QT_x_0 (e.g., +tap1 to QT_x_1 and −tap1 to QT_x_0). The appropriate output is based on the previous decision (e.g., based upon D(N−1)).

Figure 5:
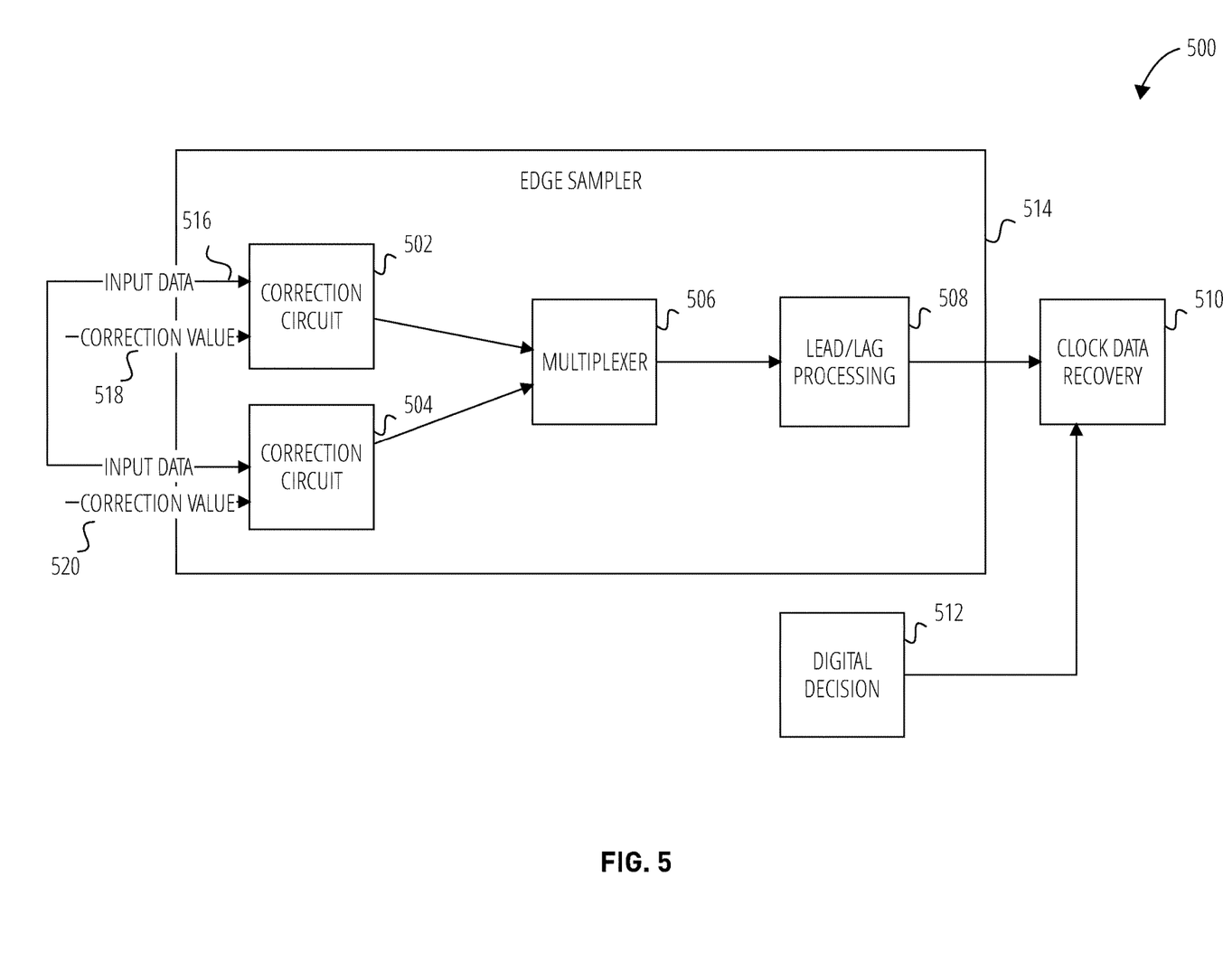
FIG. 5 illustrates an edge sampler of a differential feedback equalizer in accordance with some embodiments.

FIG. 5 illustrates an example edge sampler circuit 500 of a differential feedback equalizer in accordance with some embodiments. Edge sampler 514 is a representative edge sampler including a correction circuit 502, correction circuit 504, multiplexer 506, and lead/lag processing 508. In some embodiment the edge sampler 514 receives input data 516 (e.g., input data 402 or 404, FIG. 4). The correction circuit 502 is configured to receive input data 516 and correction value 518. For example, correction circuit 502 is configured to apply a first correction (e.g., via correction value 518) to the received input data 516. The first correction comprises a first tap that can be of a first polarity (e.g., positive, or negative) and a second tap that is of a second polarity (e.g., positive, or negative) and the output signal is fed to multiplexer 506.

The correction circuit 504 is also configured to receive input data 516 and correction value 520. Correction values 518 and 520 can be distinct values. In some embodiments, correction value 520 will apply a first tap of a third polarity (e.g., negative, or positive, but the opposite of what was used for the first tap of correction value 518), plus a second tap of a second polarity (e.g., positive, or negative, but the same used for the second tap of correction value 518). The correction circuit 504 also provides an output signal to be fed to multiplexer 506. Multiplexer 506 selects either of the received signals from the correction circuit 502 or correction circuit 504 based on a previous digital decision. In some embodiments, multiplexer 506 selects either of the received signals based on an N−1 bit, or a previous bit. The lead/lag processing 508 is configured to select signals having a transition (e.g., from a high to a low state). The output of the lead/lag processing 508 is provided as a first input to a clock data recovery 510 circuit.

Digital decision 512 is a second input to the clock data recovery 510. The digital decision 512 block is configured to provide a high or low bit based on a previous digital decision. In some embodiments, the digital decision is a bit value preceding the currently sampled bit value by two bits. In other words, the digital decision is a decision of a bit N−2. The clock and data recovery circuit 510 selects or rejects the output of the lead/lag processing according to this digital decision 512.

Figure 6:
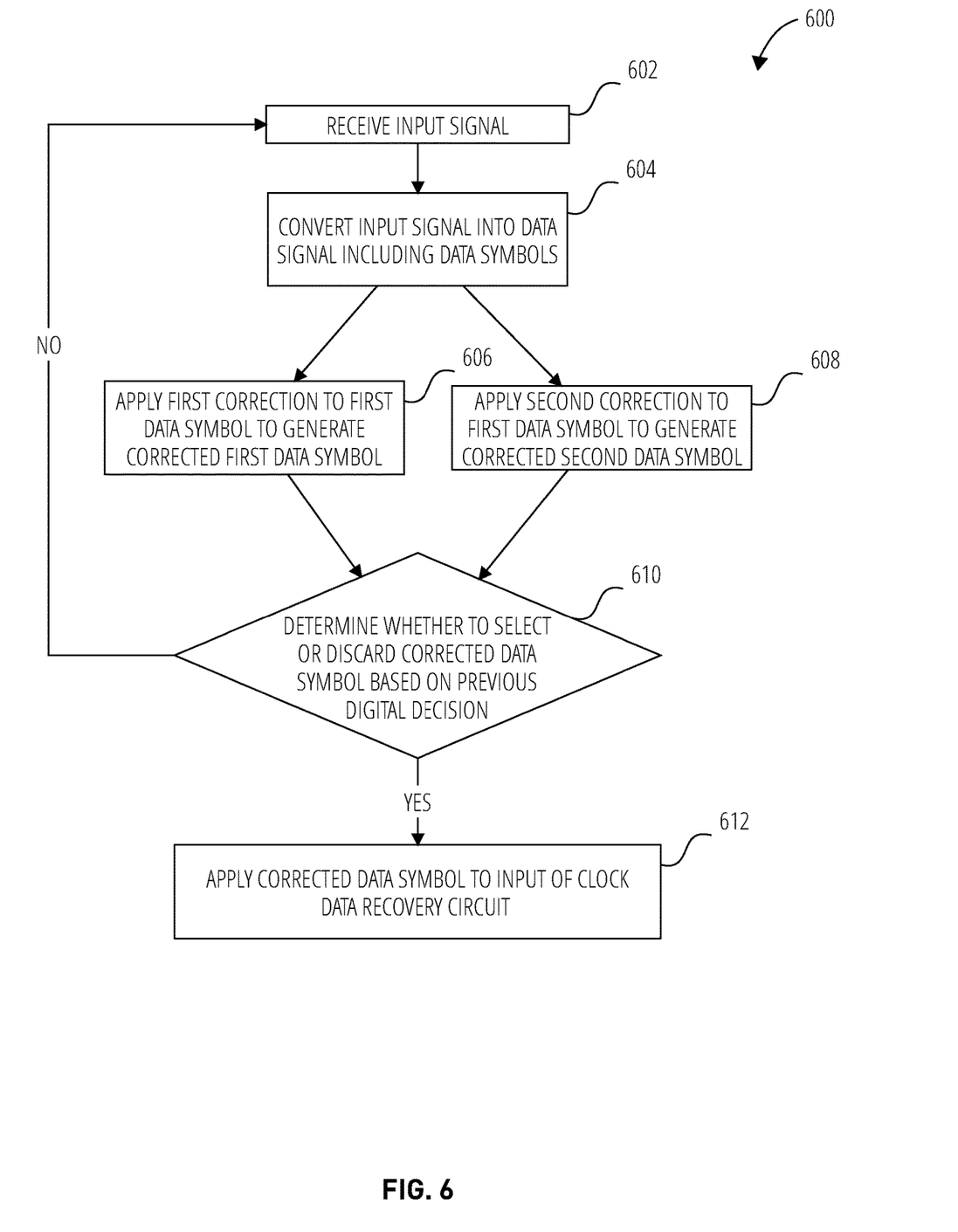
FIG. 6 illustrates a flow diagram of a method implementing a two-tap unrolled DFE topology in accordance with some embodiments.

FIG. 6 illustrates a flow diagram of a method implementing a two-tap unrolled DFE topology in accordance with some embodiments.

In this example, method 600 begins at operation 602. An edge sampler receives an input signal. At operation 604, the input signal is converted into a data symbol including one or more data symbols. The data signal includes at least a first data symbol (high or low symbol).

After operation 604, the edge sampler is configured to apply a first correction to a first data symbol to generate a corrected first data symbol at operation 608 and in parallel, at operation 606, the edge sampler is configured to apply a second correction to the first data symbol to generate a corrected second data symbol.

In some embodiments, the first correction and the second correction is an arithmetic operation. In some embodiments the first correction and the second correction are distinct. For example, a first correction is to apply a +Y factor to the first data symbol and the second correction is to apply a −Z factor to the first data symbol.

At operation 610, the edge sampler determines whether to select or discard the corrected data symbol based on previous digital decisions. For example, a previous digital decision indicates a previous bit (e.g., N−1) is low. A second previous bit (e.g., N−2) is determined to be 0. A filter is used to select the second previous data symbol as being high (e.g., 1) and the current edge sampler sampling during a transition if the previous data symbols match a filter of "1X01" or "1X10", where X indicates a "don't-care" and can be either 1 or 0, and the current edge sampler is taken between the $3^{rd}$ and $4^{th}$ bits of the filter sequence (i.e., between the final "01" or the final "10"). The last two bits of this filter thus represent the current bit and the next bit to come. In some embodiments, this filter is implemented by introducing delay in the result of the corrections 606 and 608 such that the next bit to come is already determined at the moment the filter is evaluated. Similarly, to select the second previous bit value (e.g., N−2) as low (e.g., 0), a filter of "0X01" or "0X10" is used.

In response to a determination that the bit pattern matches with the filter, the selected corrected data symbol is passed through to the clock and data recovery circuit at operation 612, to compute lead/lag correction along with the current and next bit values. If the bit pattern does not match the filter, this particular selected corrected data symbol and the corresponding computation of the lead/lag correction by the clock and data recovery circuit are ignored. The operations of method 600 can be repeated as needed.

Figure 7:
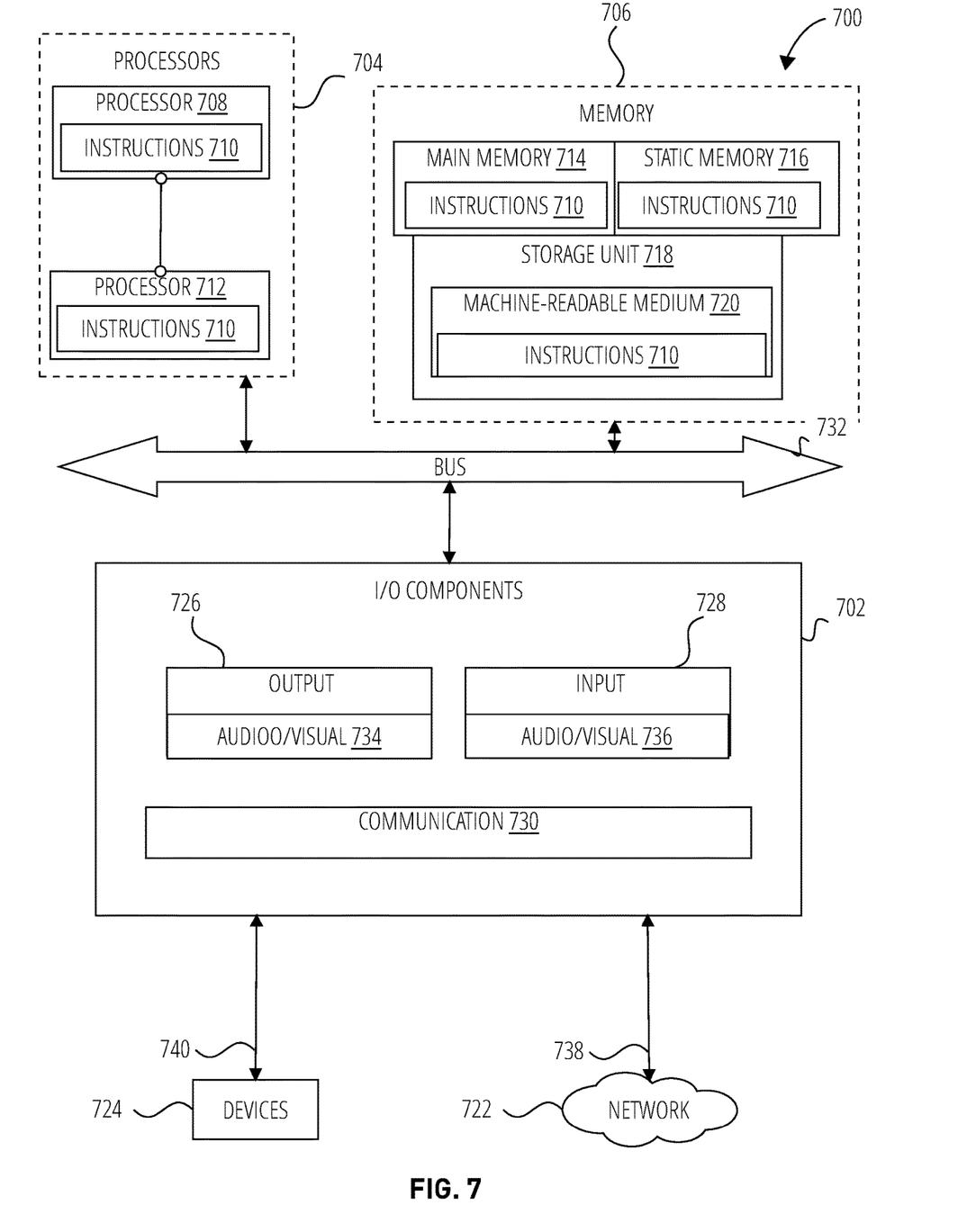
FIG. 7 is a block diagram of an example system for implementing a two tap DFE in accordance with some embodiments.

FIG. 7 is a block diagram illustrating components of a device 700 according to some embodiments, able to read instructions from a machine-readable medium (e.g., machine-readable storage medium or machine-readable storage device) and perform any one or more of the methodologies discussed herein. The instructions can cause the device 700 to execute the method illustrated in FIG. 6. Additionally, or alternatively, the instructions 710 can implement one or more of the components of FIGS. 1-3. The instructions 710 transform the general, non-programmed device 700 into a particular device 700 programmed to carry out the described and illustrated functions in the manner described. In alternative embodiments, the device 700 operates as a standalone device or can be coupled (e.g., connected) to other machines.

The device 700 can comprise, but can not be limited to, a server computer, a client computer, a personal computer (PC), a tablet computer, a laptop computer, a netbook, a PDA, or any machine capable of executing the instructions 710, sequentially or otherwise, that specify actions to be taken by device 700. Further, while only a single device 700 is illustrated, the term "machine" shall also be taken to include a collection of devices 700 that individually or jointly execute the instructions 710 to perform any one or more of the methodologies discussed herein.

The device 700 can include processors 704, memory/storage 706, and I/O components 702, which can be configured to communicate with each other such as via a bus 732. In an example embodiment, the processors 708 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) can include, for example, processor 708 and processor 712 that can execute the instructions 710. The term "processor" is intended to include multi-core processor that can comprise two or more independent processors (sometimes referred to as "cores") that can execute instructions 710 contemporaneously. Although FIG. 7 shows multiple processors 704, the device 700 can include a single processor with a single core, a single processor with multiple cores (e.g., a multi-core process), multiple processors with a single core, multiple processors with multiples cores, or any combination thereof.

The memory/storage 706 can include a memory 714, such as a main memory, or other memory storage, and a storage unit 718, both accessible to the processors 708 such as via the bus 732. The storage unit 718 and memory/storage 706 store the instructions 710 embodying any one or more of the methodologies or functions described herein. The instructions 710 can also reside, completely or partially, within the memory 716, within the storage unit 718, within at least one of the processors 704 (e.g., within the processor's cache memory), or any suitable combination thereof, during execution thereof by the device 700. Accordingly, the memory 714, the storage unit 718, and the memory of processors 704 are examples of machine-readable media.

As used herein, "machine-readable medium" includes a machine-readable storage device able to store instructions 710 and data temporarily or permanently and can include, but is not limited to, random-access memory (RAM), read-only memory (ROM), buffer memory, flash memory, optical media, magnetic media, cache memory, other types of storage (e.g., Erasable Programmable Read-Only Memory (EEPROM)) and/or any suitable combination thereof. The term "machine-readable medium" should be taken to include a single medium or multiple media (e.g., a centralized or distributed database, or associated caches and servers) able to store instructions 710. The term "machine-readable medium" shall also be taken to include any medium, or combination of multiple media, that is capable of storing instructions (e.g., instructions 710) for execution by a device (e.g., device 700), such that the instructions, when executed by one or more processors of the device 700 (e.g., processors 704), cause the device 700 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

The input/output (I/O) components 702 can include a wide variety of components to receive input, provide output, produce output, transmit information, exchange information, capture measurements, and so on. The specific I/O components 702 that are included in a particular machine will depend on the type of machine. For example, portable machines such as mobile phones will likely include a touch input device or other such input mechanisms, while a headless server machine will likely not include such a touch input device. It will be appreciated that the I/O components 702 can include many other components that are not shown in FIG. 7. The I/O components 702 are grouped according to functionality merely for simplifying the following discussion and the grouping is in no way limiting. In various example embodiments, the I/O components 702 can include output components 726 and input components 728. The output components 726 can include audio/visual components 734 (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 728 can include audio/visual decides 736 having alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or other pointing instrument), tactile input components (e.g., a physical button, a touch screen that provides location and/or force of touches or touch gestures, or other tactile input components), audio input components (e.g., a microphone), and the like.

Communication can be implemented using a wide variety of technologies. The I/O components 702 can include communication components 730 operable to couple the device 700 to a network 722 or devices 724 via coupling 738 and coupling 740, respectively. For example, the communication components 730 can include a network interface component or other suitable device to interface with the network 722. In further examples, communication components 730 can include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 724 can be another machine or any of a wide variety of peripheral devices (e.g., a peripheral device coupled via a USB).

Moreover, the communication components 730 can detect identifiers or include components operable to detect identifiers. For example, the communication components 730 can include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF416, Ultra Code, UCC RSS-2D bar code, and other optical codes), or acoustic detection components (e.g., microphones to identify tagged audio signals). In addition, a variety of information can be derived via the communication components 730, such as location via Internet Protocol (IP) geo-location, location via Wi-Fi® signal triangulation, location via detecting an NFC beacon signal that can indicate a particular location, and so forth.

The instructions 710 can be transmitted or received over the network 722 using a transmission medium via a network interface device (e.g., a network interface component included in the communication components 730) and utilizing any one of a number of well-known transfer protocols (e.g., hypertext transfer protocol (HTTP)). Similarly, the instructions 710 can be transmitted or received using a transmission medium via the coupling 740 (e.g., a peer-to-peer coupling) to devices 724. The term "transmission medium" shall be taken to include any intangible medium that is capable of storing, encoding, or carrying instructions 710 for execution by the device 700, and includes digital or analog communications signals or other intangible medium to facilitate communication of such software.

Figure 8:
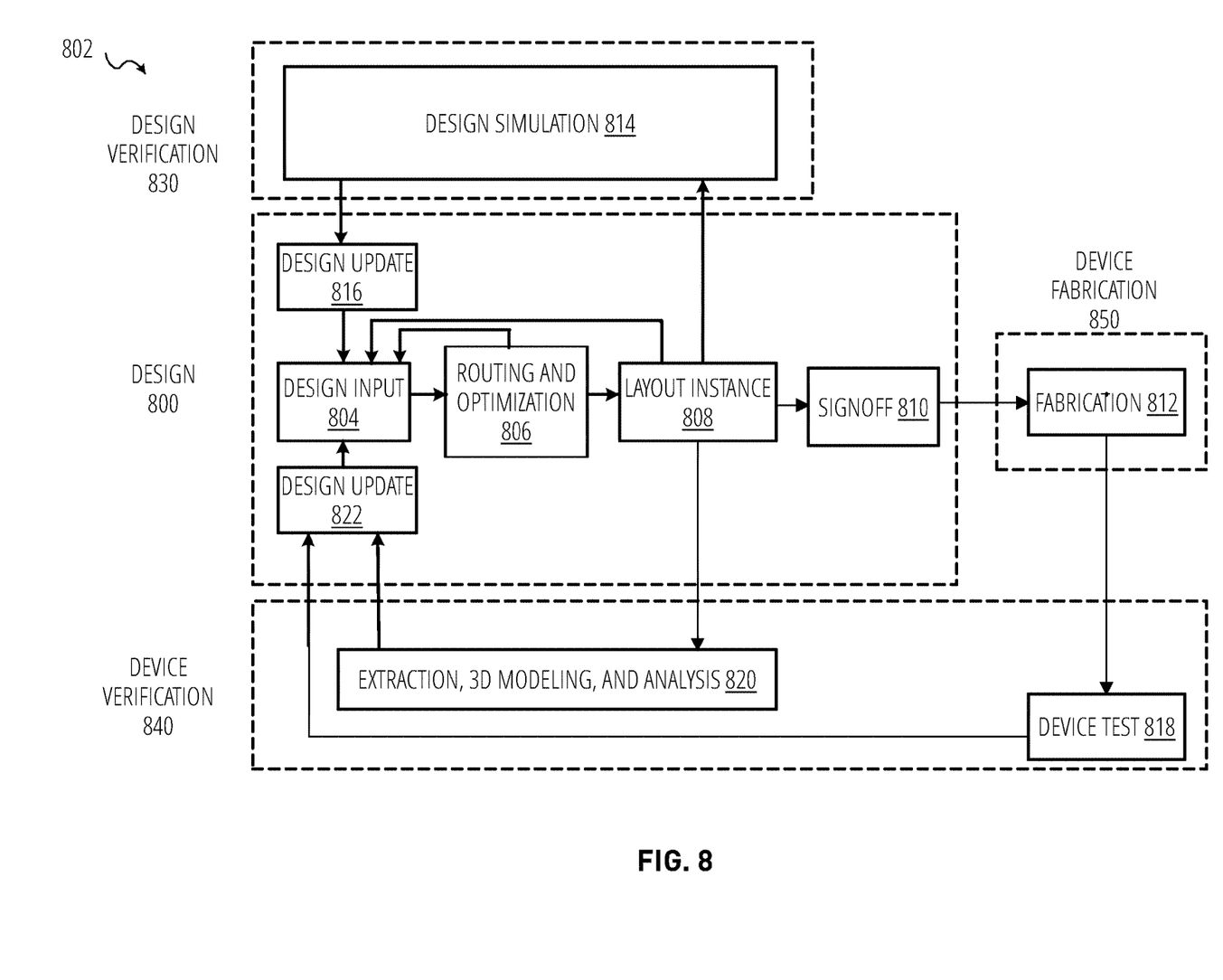
FIG. 8 is a diagram illustrating an example design process flow for implementing a two tap DFE in accordance with some embodiments.

FIG. 8 is a diagram illustrating an example design process flow 802, according to some embodiments. As shown, the design process flow 802 includes a design phase 800, a device fabrication phase 850, a design verification phase 830, and a device verification phase 840. The design phase 800 involves an initial design input 804 operation where the basic elements and functionality of a device are determined, as well as revisions based on various analyses and optimization of a circuit design. This design input 804 operation is where block instances are used in the circuit design and any additional circuitry for the design around the blocks is selected. The initial strategy, tactics, and context for the device to be created are also generated in the design input 804 operation, depending on the particular design algorithm to be used.

In some embodiments, following an initial selection of design values in the design input 804 operation, routing, timing analysis, and optimization are performed in a routing and optimization 806 operation, along with any other automated design processes. While the design process flow 802 shows optimization 806 occurring prior to a layout instance 808, routing, timing analysis, and optimization 806 can be performed at any time to verify operation of a circuit design. For instance, in various embodiments, timing analysis in a circuit design can be performed prior to routing of connections in the circuit design, after routing, during register transfer level (RTL) operations, or as part of a signoff 810, as described below.

After design inputs are used in the design input 804 operation to generate a circuit layout, and any of the routing and optimization 806 operations are performed, a layout is generated in the layout instance 808. The layout describes the physical layout dimensions of the device that match the design inputs. Prior to this layout being provided to a fabrication 812 operation, the signoff 810 is performed on the circuit design defined by the layout.

After signoff verification by the signoff 810, a verified version of the layout is used in the fabrication 812 operation to generate a device, or additional testing and design updates can be performed using designer inputs or automated updates based on design simulation 814 operations or extraction, 3D modeling, and analysis 820 operations. Once the device is generated, the device can be tested as part of device test 818 operations, and layout modifications generated based on actual device performance.

A design update 816 from the design simulation 814; a design update 822 from the device test 818 or the extraction, 3D modeling, and analysis 720 operations; or the design input 804 operation can occur after the initial layout instance 808 is generated. In various embodiments, whenever design inputs are used to update or change an aspect of a circuit design, a timing analysis and the routing and optimization 806 operation can be performed.

What is claimed is:

1. A non-transitory computer-readable medium comprising instructions that, when executed by one or more processors of a computing device, cause the computing device to generate a circuit design by performing operations comprising:

configuring, in a circuit design, a first portion of a decision feedback equalizer configured to apply a first correction, including a first tap having a polarity and a second tap, to a first symbol of a data signal received by a data sampler circuit;

configuring, in the circuit design, a second portion of the decision feedback equalizer configured to apply a second correction, including the first tap having an inverse polarity of the first tap of the first correction and the second tap, to the first symbol of the data signal, the first correction and the second correction being applied in parallel to the first symbol;

configuring, in the circuit design, a multiplexer configured to receive an output of the first portion of the decision feedback equalizer, an output of the second portion of the decision feedback equalizer, and configured to select an output of either the first or second portion based upon a previous symbol of the data signal; and configuring, in the circuit design, a clock and data recovery circuit configured to receive an output of the multiplexer and an input of a previous data decision by the decision feedback equalizer.

2. The computer-readable medium of claim 1, wherein the data signal includes one or more data symbols, and the input of the previous data decision is one or more data symbols preceding the first data symbol used to select or reject the output of the multiplexer.

3. The computer-readable medium of claim 2, wherein the one or more data symbols preceding the first data symbol precede the first data symbol by two data bits.

4. The computer-readable medium of claim 1, wherein the first polarity of the first correction and the second polarity of the second correction are a same polarity.

5. The computer-readable medium of claim 1, wherein the first polarity of the first correction and the second polarity of the second correction are distinct polarities.

6. The computer-readable medium of claim 1, wherein the clock and data recovery circuit is configured to apply a filter to select or reject the output of the multiplexer.

7. The computer-readable medium of claim 6, wherein the filter selects a high data symbol in accordance with a first filter pattern.

8. The computer-readable medium of claim 6, wherein the filter selects a low data symbol in accordance with a second filter pattern.

9. A circuit, comprising:

a data sampler circuit including a first portion for applying a first correction and a second portion for applying a second correction, a multiplexer coupled to the first and the second portions; and a clock data recovery circuit coupled to the data sampler circuit, wherein:

the first portion of the data sampler circuit is configured to:

receive a data signal including data symbols;

apply a first correction on a first data symbol of the data signal, the first correction including a first tap having a polarity and a second tap;

generate a first corrected data symbol based on the first correction; and output the first corrected data symbol;

the second portion of the data sampler circuit is configured to:

receive the data signal;

apply a second correction on the first data symbol, the second correction including the first tap having an inverse polarity of the first tap of the first correction and the second tap;

generate a second corrected data symbol based on the second correction; and output the second corrected data symbol;

the multiplexer configured to:

receive the first corrected data symbol;

receive the second corrected data symbol;

select the first or the second corrected data symbol; and output the selected corrected data symbol to the clock data recovery circuit.

10. The circuit of claim 9, wherein the data signal includes one or more data symbols, and the clock data recovery circuit comprises a second input, the second input being a data symbol preceding the first data symbol of the data signal used to select or reject the selected corrected data symbol.

11. The circuit of claim 10, wherein the one or more data symbol preceding the first data symbol precedes the first data symbol by two bits.

12. The circuit of claim 9, wherein the first polarity of the first correction and the second polarity of the second correction are a same polarity.

13. The circuit of claim 9, wherein the first polarity of the first correction and the second polarity of the second correction are distinct polarities.

14. The circuit of claim 9, wherein the data sampler circuit is configured to apply a filter to select a previous data decision corresponding to a data symbol preceding the first data symbol.

15. The circuit of claim 14, wherein the filter selects a high data bit representation in accordance with a first filter pattern.

16. The circuit of claim 14, wherein the filter selects a high data bit representation in accordance with a second filter pattern.

17. A method, comprising:

receiving a first data symbol of a data signal at a first portion of a data sampler circuit for applying a first correction;

receiving the first data symbol at a second portion of the data sampler circuit for applying a second correction;

applying a first correction to the first data symbol of the data signal including a first tap having a polarity and a second tap to generate a first corrected data symbol;

applying a second correction to the first data symbol of the data signal including the first tap having an inverse polarity of the first tap of the first correction and the second tap, to generate a second corrected data symbol;

providing the first and second corrected data symbols to a comparator;

receiving a previous digital decision corresponding to a preceding data symbol of the data signal;

providing an output of the comparator and the previous digital decision to a clock data recovery circuit; and selecting or rejecting the output of the comparator based upon the previous digital decision.

18. The method of claim 17, wherein receiving the previous digital decision comprises:

applying a filter to select a plurality of data symbols that indicates a high data bit representation.

19. The method of claim 17, wherein receiving the previous digital decision comprises:

applying a filter to select a plurality of data symbols that indicates a low data bit representation.

20. The method of claim 18, wherein the filter is configured to select a bit representation of a bit preceding a bit representation of the first data symbol by two bits.

* * * * *